United States Patent
Kotani et al.

(10) Patent No.: US 7,968,363 B2
(45) Date of Patent: Jun. 28, 2011

(54) MANUFACTURE METHOD FOR ZNO BASED SEMICONDUCTOR CRYSTAL AND LIGHT EMITTING DEVICE USING SAME

(75) Inventors: Hiroshi Kotani, Tokyo (JP); Michihiro Sano, Tokyo (JP); Hiroyuki Kato, Tokyo (JP); Akio Ogawa, Tokyo (JP)

(73) Assignee: Stanley Electric Co., Ltd., Tokyo (JP)

(*) Notice: Subject to any disclaimer, the term of this patent is extended or adjusted under 35 U.S.C. 154(b) by 0 days.

(21) Appl. No.: 12/749,401

(22) Filed: Mar. 29, 2010

(65) Prior Publication Data

US 2010/0181550 A1    Jul. 22, 2010

Related U.S. Application Data

(62) Division of application No. 11/589,998, filed on Oct. 31, 2006, now abandoned.

(30) Foreign Application Priority Data

Nov. 1, 2005  (JP) ................................. 2005-317973

(51) Int. Cl.
*H01L 21/20* (2006.01)

(52) U.S. Cl. ................ 438/47; 438/44; 438/45; 438/46; 257/E21.09; 257/E21.093; 257/E21.098; 257/E21.11

(58) Field of Classification Search .............. 438/44–47; 257/E21.09, 93, 98, 11
See application file for complete search history.

(56) References Cited

U.S. PATENT DOCUMENTS 7,482,618 B2  1/2009  Kato et al.

(Continued)

FOREIGN PATENT DOCUMENTS

JP  2002-76026 A  3/2002

(Continued)

OTHER PUBLICATIONS

Kato et al., "High-quality ZnO epilayers grown on Zn-face Zno substrates by plasma-assisted molecular beam epitaxy," J. of Crystal Growth, 265, 2004, pp. 375-381.

Ko et al., "Investigation of ZnO epilayers grown under various Zn/O ratios by plasma-assisted molecular-beam epitaxy" Journal of Applied Physics, vol. 92, No. 8, Oct. 15, 2002, pp. 4354-4360.

Kato et al., "MBE growth of Zn-polar ZnO on MOCVD-ZnO templates," Phys. Stat. Sol., 241, 2004, pp. 2825-2829.

(Continued)

*Primary Examiner* — Kiesha R Bryant
*Assistant Examiner* — Minchul Yang
(74) *Attorney, Agent, or Firm* — Chen Yoshimura LLP

(57) ABSTRACT

A manufacture method for zinc oxide (ZnO) based semiconductor crystal includes providing a substrate having a Zn polarity plane; and reacting at least zinc (Zn) and oxygen (O) on the Zn polarity plane of said substrate to grow ZnO based semiconductor crystal on the Zn polarity plane of said substrate in a Zn rich condition. (a) An n-type ZnO buffer layer is formed on a Zn polarity plane of a substrate. (b) An n-type ZnO layer is formed on the surface of the n-type ZnO buffer layer. (c) An n-type ZnMgO layer is formed on the surface of the n-type ZnO layer. (d) A ZnO/ZnMgO quantum well layer is formed on the surface of the n-type ZnMgO layer, by alternately laminating a ZnO layer and a ZnMgO layer.☐ @(e) A p-type ZnMgO layer is formed on the surface of the ZnO/ZnMgO quantum well layer. (f) A p-type ZnO layer is formed on the surface of the p-type ZnMgO layer.☐ @(g) An electrode is formed on the n-type ZnO layer and p-type ZnO layer. The n-type ZnO layer is formed under a Zn rich condition at the step (b).

5 Claims, 8 Drawing Sheets

U.S. PATENT DOCUMENTS

| | | |
|---|---|---|
| 2003/0186088 A1 | 10/2003 | Kato et al. |
| 2005/0145840 A1 | 7/2005 | Kato et al. |
| 2006/0170013 A1 | 8/2006 | Kato et al. |

FOREIGN PATENT DOCUMENTS

| | | |
|---|---|---|
| JP | 2004-363382 A | 12/2004 |
| JP | 2005-197410 A | 7/2005 |

OTHER PUBLICATIONS

Japanese Office Action in a counterpart application No. 2005-317973, dated Apr. 5, 2011, citing Foreign Patent documents Nos. 1-3 above and Non-Patent Literature Kato et al., "High-quality ZnO epilayers grown on Zn-face Zno substrates by plasma-assisted molecular beam epitaxy," Journal of Crystal Growth, 265, 2004, pp. 375-381, which has been submitted in a previous IDS. Partial translation of the Office Action is attached as a concise explanation of revelance.

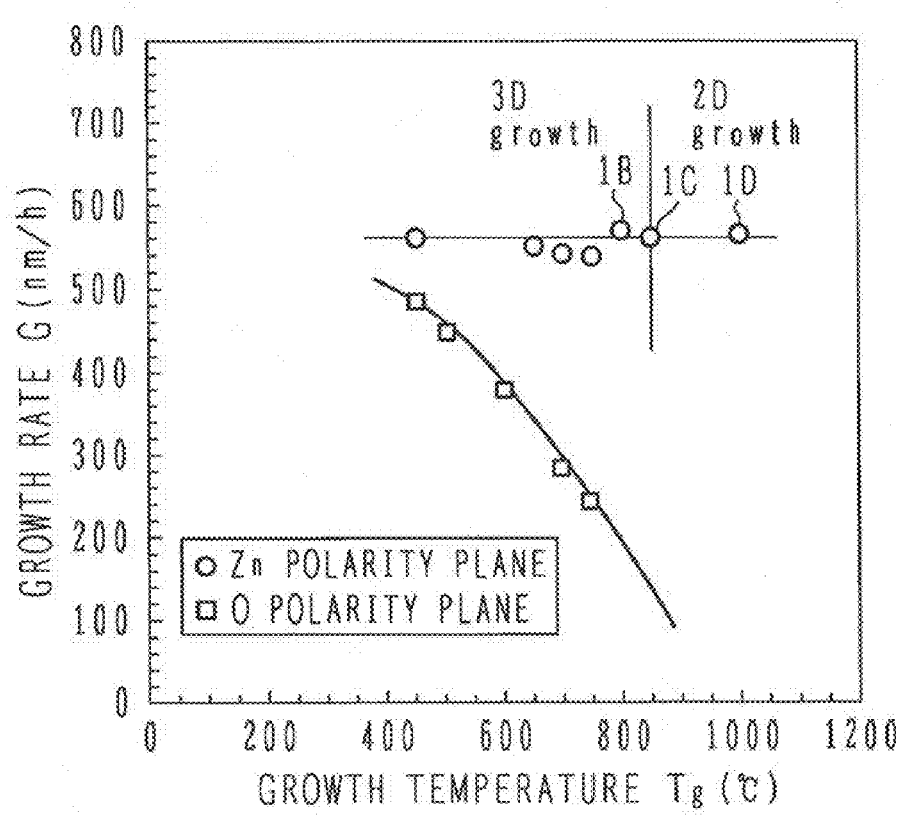

| $T_g$ (°C) | FWHM of ω-rocking curves (arcsec) | |
|---|---|---|
| | (0002) | (10-10) |
| 450 | 262 | 100 |
| 700 | 42 | 46 |

MANUFACTURE METHOD FOR ZNO BASED SEMICONDUCTOR CRYSTAL AND LIGHT EMITTING DEVICE USING SAME

CROSS REFERENCE TO RELATED APPLICATION

This application is a divisional of pending, application Ser. No. 11/589,998 filed on Oct. 31, 2006, which is herby incorporated by reference in its entiety.

This application is based on and claims priority of Japanese Patent Application No. 2005-317973 filed on Nov. 1, 2005, the entire contents of which are incorporated herein by reference.

BACKGROUND OF THE INVENTION

A) Field of the Invention

The present invention relates to ZnO semiconductor and ZnO based compound semiconductor and further relates to a ZnO based light emitting device.

B) Description of the Related Art

Zinc oxide (ZnO) is direct transition type semiconductor having a band gap of 3.37 eV at a room temperature. Since a binding energy of exciton is as large as 60 meV, ZnO is expected as the material of a high efficiency light emitting device.

A high quality ZnO thin film can be formed on a ZnO substrate by epitaxial growth while preventing lattice mismatch. A ZnO substrate is formed by cutting a bulk crystal grown by, for example, hydrothermal synthesis.

A high quality ZnO thin film can be formed by molecular beam epitaxy (MBE). For example, ZnO is grown on a substrate by radiating, in an electrodeless discharge tube, an oxygen radical beam and a zinc (Zn) beam from a Knudsen cell (K cell) at the same time by using a radio frequency of 13.56 MHz to the substrate that has been heated to a growth temperature.

An epitaxial film of ZnO can be formed by setting the growth temperature Tg and flux ratios in a desired manner. A flux intensity of Zn is represented by $J_{Zn}$, and a flux intensity of O radical is represented by $J_O$. A coefficient (Zn sticking coefficient) indicating a bonding feasibility of Zn to an O terminated plane of ZnO crystal is represented by $k_{Zn}$, and a coefficient (O sticking coefficient) indicating a bonding feasibility of O to a Zn terminated plane of ZnO crystal is represented by $k_O$. In this case, a product of the Zn sticking coefficient $k_{Zn}$ and Zn flux intensity $J_{Zn}$, $k_{Zn} \cdot J_{Zn}$, corresponds to the number of Zn atoms bonded in a unit area of a ZnO substrate per unit time. A product of the O sticking coefficient $k_O$ and O flux intensity $J_O$, $k_O \cdot J_O$, corresponds to the number of O atoms bonded in a unit area of a ZnO substrate per unit time. The condition satisfying that the product $k_{Zn} \cdot J_{Zn}$ is equal to the product $k_O \cdot J_O$ is called a stoichiometry condition.

A flux ratio is defined by $k_O \cdot J_O / k_{Zn} \cdot J_{Zn}$ (a ratio of a product of the O sticking coefficient and O flux intensity to a product of the Zn sticking coefficient and Zn flux intensity).

In a ZnO thin film forming process, $k_O \cdot J_O / k_{Zn} \cdot J_{Zn} > 1$, i.e., the flux ratio being larger than the flux ratio of the stoichiometry condition, is called an O rich condition (film forming condition realizing O rich). $k_O \cdot J_O / k_{Zn} \cdot J_{Zn} < 1$, i.e., the flux ratio being smaller than the flux ratio of the stoichiometry condition, is called a Zn rich condition (film forming condition realizing Zn rich).

A relation between the Zn flux intensity and the ZnO film growth rate on a Zn polarity plane (+c plane) is known. See "High-quality ZnO epilayers grown on Zn-face ZnO substrates by plasma-assisted molecular beam epitaxy" by Hiroyuki Kato, Michihiro Sano, Kazuhiro Miyamoto, and Takafumi Yao, Journal of Crystal Growth 265 (2004); pp. 375-381), which is hereby incorporated by reference in its entirety.

The growth rate of a ZnO film can be calculated by the following equation (1):

$$G=[(k_{Zn} \cdot J_{Zn})^{-1}+(k_O \cdot J_O)^{-1}]^{-1}-R_{ZnO} \tag{1}$$

where $R_{ZnO}$ is a re-evaporation rate of ZnO. $R_{ZnO}$ can be neglected at a growth temperature of 800° C. or lower.

The above-mentioned document reports the formation of ZnO films with various flax ratios, and found that reflection high energy electron diffraction (RHEED) images exhibit streak patterns only when ZnO films are formed under the extreme O rich condition (flux ratio of 5.6). It also reports that a flat surface profile (surface roughness of 2.9 nm) was obtained when measured by atomic force microscopy (AFM). It is also confirmed from these results that a ZnO thin film grows two-dimensionally.

In forming an n-type ZnO thin film to be used for a light emitting device, Ga, Al, In and the like are used as n-type impurities.

SUMMARY OF THE INVENTION

An object of the present invention is to provide a manufacture method for ZnO crystal or ZnO based compound semiconductor crystal having a high activation ratio.

Another object of the present invention is to provide a manufacture method for a ZnO based light emitting device which contains ZnO crystal or ZnO based compound semiconductor crystal having a high activation ratio.

Still another object of the present invention is to provide an improved ZnO based semiconductor substrate and an improved ZnO based light emitting device.

According to one aspect of the present invention, there is provided a manufacture method for zinc oxide (ZnO) based semiconductor crystal, including providing a substrate having a Zn polarity plane; and reacting at least zinc (Zn) and oxygen (O) on the Zn polarity plane of said substrate to grow ZnO based semiconductor crystal on the Zn polarity plane of said substrate in a Zn rich condition.

According to another aspect of the present invention, there is provided a manufacture method for a ZnO based light emitting device, including (a) forming an n-type ZnO buffer layer on a Zn polarity plane of a substrate; (b) forming an n-type ZnO layer over said n-type ZnO buffer layer; (c) forming an n-type ZnMgO layer over said n-type ZnO layer; (d) forming a ZnO/ZnMgO quantum well layer over said n-type ZnMgO layer, said ZnO/ZnMgO quantum well layer being formed by alternately laminating a ZnO layer and a ZnMgO layer; (e) forming a p-type ZnMgO layer over said ZnO/ZnMgO quantum well layer; and (f) forming a p-type ZnO layer over said p-type ZnMgO layer, wherein said n-type ZnO layer is formed in a Zn rich condition in said step (b).

In another aspect, the present invention provides a ZnO based semiconductor substrate, including a substrate; and a ZnO based semiconductor film over the substrate, the ZnO based semiconductor film being doped with impurities at a concentration ranging from about $5.0 \times 10^{17}$ cm$^{-3}$ to about $7.0 \times 10^{19}$ cm$^{-3}$, the ZnO based semiconductor film having an activation ratio of the impurities of about 0.5 or higher.

In another aspect, the present invention provides a ZnO based light emitting device, including a plurality of n-side ZnO layers; and at least one p-type ZnO layer electrically connected to one or more of the plurality of n-type ZnO layers, wherein at least one of the plurality of n-side ZnO layers includes a ZnO based semiconductor film doped with impurities at a concentration ranging from about $5.0 \times 10^{17}$ cm$^{-3}$ to about $7.0 \times 10^{19}$ cm$^{-3}$, the ZnO based semiconductor film having an activation ratio of the impurities of about 0.5 or higher.

According to the present invention, it is possible to manufacture improved ZnO based semiconductor crystal (ZnO crystal and ZnO based compound semiconductor crystal) as well as an improved ZnO based semiconductor substrate and light emitting devices using the same.

BRIEF DESCRIPTION OF THE DRAWINGS

FIG. 1A is a graph showing the relation between a growth temperature Tg and a growth rate G of a ZnO film grown on a Zn polarity plane (+c plane) of a ZnO substrate and a ZnO film grown on an O polarity plane (−c plane) of a ZnO substrate.

DESCRIPTION OF THE PREFERRED EMBODIMENTS

Figures 7, 8:
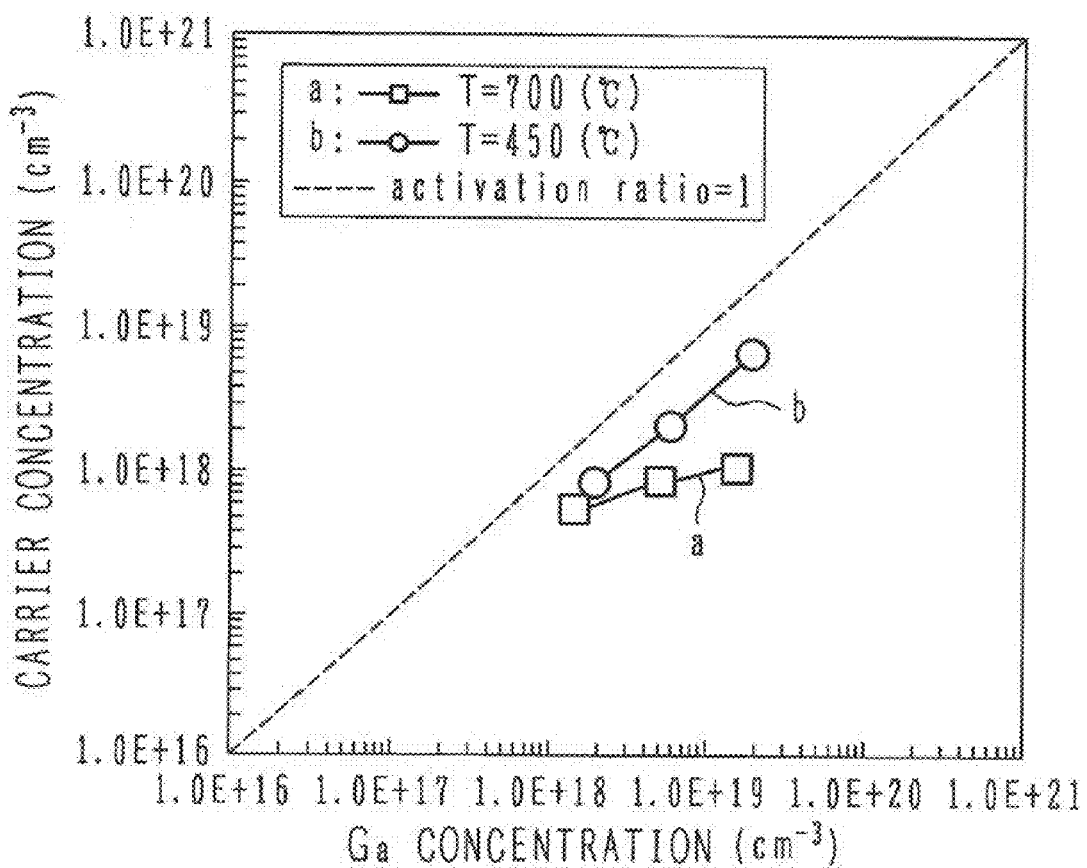
FIG. 7 is a graph showing the relation between a Ga concentration and a carrier (n) concentration in a ZnO film (doped with Ga impurities) epitaxially grown on a Zn polarity plane of a ZnO substrate.
FIG. 8 is a diagram showing measurement results of X-ray double crystal rocking curves of ZnO films (doped with Ga impurities) grown at 450° C. and 700° C.

FIG. 7 is a graph showing the relation between a Ga concentration and a carrier (n) concentration in a ZnO film (doped with Ga impurities) epitaxially grown on a Zn polarity plane of a ZnO substrate.

ZnO films having a high flatness were two-dimensionally grown under an extreme O rich condition that were realized by setting an O flux intensity $J_O$ to $1.0 \times 10^{15}$ atoms/cm$^2$·s and a Zn flux intensity $J_{Zn}$ to $2.0 \times 10^{14}$ atoms/cm$^2$·s.

The abscissa of the graph represents a Ga concentration in ZnO films in the unit of "cm$^{-3}$", and the ordinate represents a carrier concentration in the unit of "cm$^{-3}$". Both axes are in the logarithmic scale. The Ga concentration and carrier concentration were measured by secondary ion mass spectrometry (SIMS) and Hall effects, respectively.

The lines interconnecting white squares (the connecting lines "a") indicate the relation between a Ga concentration and a carrier concentration in ZnO films grown at a temperature of 700° C., and the lines interconnecting white circles (the connecting lines "b") indicates the relation between a Ga concentration and a carrier concentration in ZnO films grown at a temperature of 450° C.

A broken line shown in FIG. 7 indicates an activation ratio of "1". The activation ratio is defined by (the carrier concentration)/(the Ga concentration) and is an index representing how much Ga impurities actually contribute to generation of carriers.

Referring to the lines "a," in the ZnO film grown at 700° C., the carrier concentration does not increase at the same rate as the Ga concentration increases. Specifically, when the Ga concentration is $1.25 \times 10^{18}$ cm$^{-3}$, the carrier concentration is $4.5 \times 10^{17}$ cm$^{-3}$ (activation ratio of 0.36), whereas when the Ga concentration is $1.0 \times 10^{19}$ cm$^{-3}$, the carrier concentration is $6.0 \times 10^{17}$ cm$^{-3}$ (activation ratio of 0.06). As understood from a gentler slope of the lines "a" than that of the broken line at the activation ratio of "1", the activation ratio of the ZnO film grown at 700° C. decrease as the Ga concentration increases. This may be due to the fact that some of Ga elements doped in the ZnO film grown at 700° C. do not function as carrier suppliers because of oxidation of Ga.

Referring to the lines "b," in the ZnO film grown at 450°, the carrier concentration increases at approximately the same rate as the Ga concentration increases, and therefore the slope of the lines "b" is approximately equal to that of the broken line at the activation ratio of "1". The activation ratio of the ZnO film grown at 450° C. lowers slightly in the range represented by the lines "b" (specifically, it decreases slightly from 0.41 to 0.34). This may be ascribed to the fact that Ga oxidation is suppressed because of the lower growth temperature of 450° C. However, even if the ZnO film is grown at 450° C., the activation ratio does not approach "1" as the Ga concentration increases.

FIG. 8 is a diagram showing measurement results of X-ray double crystal rocking curves of ZnO films (doped with Ga impurities) grown at 450° C. and 700° C. The (0002) plane and (10-10) plane were used as the measurement subject planes, and the measurement results of a full-width at half-maximum (FWHM) were indicated in the unit of "arcsec".

The ZnO films grown at 450° C. and 700° C. have FWHM values of "262"and "42" at the (0002) plane, respectively, and FWHM values of "100" and "46" at the (10-10) plane, respectively. Therefore, it was found that at both the planes, the ZnO film grown at 450° C. has a broader FWHM value and cannot realize as high a crystallinity as that of the ZnO film grown at 700° C.

Figure 9:
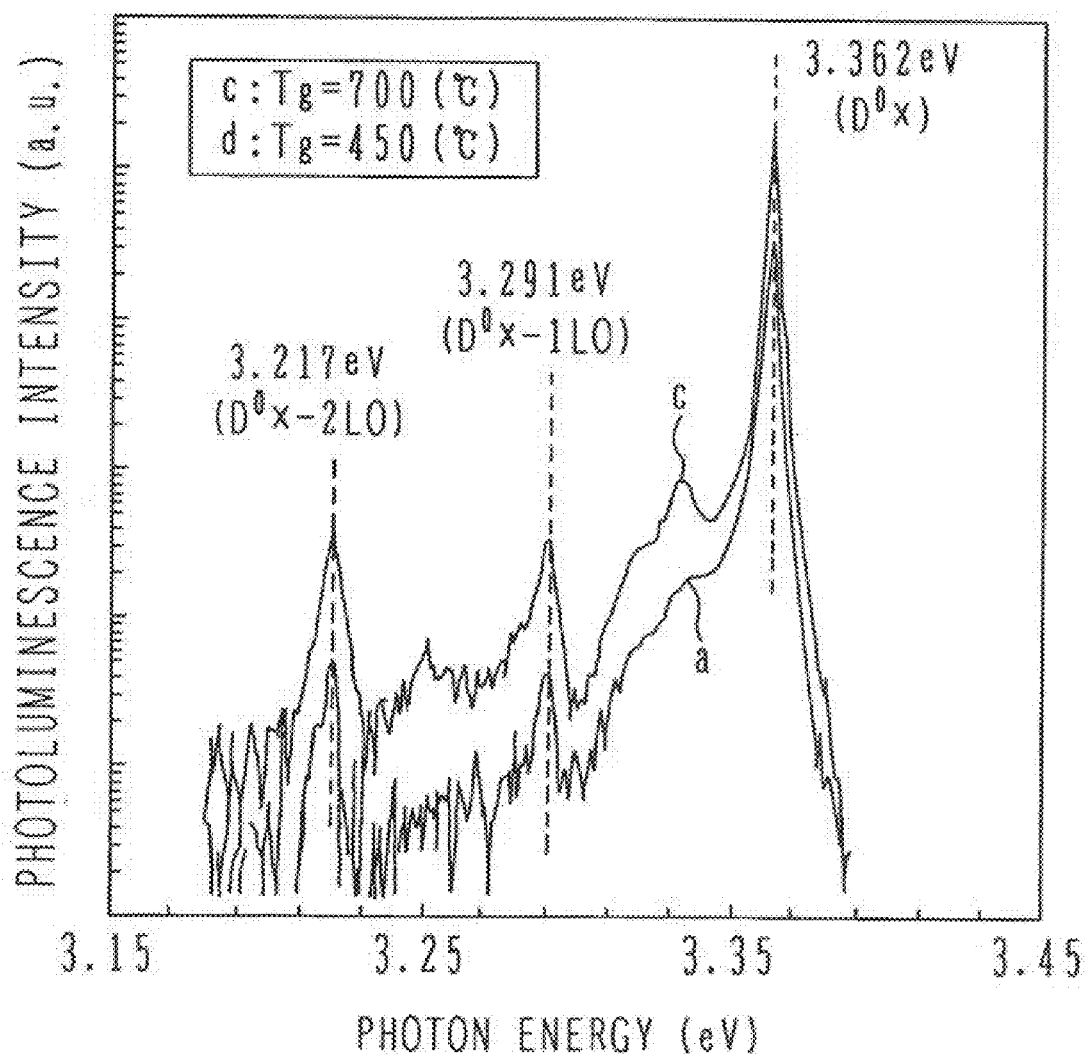
FIG. 9 is a diagram showing the results of photoluminescence of ZnO films (doped with Ga impurities at a concentration of $5 \times 10^{18}$ cm$^{-3}$) grown on the Zn polarity plane at 450° C. and 700° C.

FIG. 9 is a diagram showing the results of photoluminescence measurement on ZnO films (doped with Ga impurities at a concentration of $5 \times 10^{18}$ cm$^{-3}$) grown on the Zn polarity plane at 450° C. and at 700° C., respectively. The photoluminescence measurement temperature was set to 4.2 K.

The abscissa represents a photon energy in the unit of "eV", and the ordinate represents a photoluminescence intensity in an "arbitrary unit (a.u.)". The curve "c" indicates the relation between the photon energy and photoluminescence intensity for the ZnO film grown at 700° C., and the curve "d_" indicates the relation between these quantities for the ZnO film grown at 450° C.

The carrier concentration of the ZnO film grown at 450° C. was $2 \times 10^{18}$ cm$^{-3}$ and that of the ZnO film grown at 700° C. was $9 \times 10^{17}$ cm$^{-3}$.

A peak at $D^0X$ in the graph is formed by emission from excitons bound to neutral donors. Peaks at $D^0X$-1LO and $D^0X$-2LO result from the peak at $D^0X$. As compared to the ZnO film grown at 700° C., the ZnO film grown at 450° C. has a lower photoluminescence intensity at $D^0X$ although it has a higher carrier concentration. This may be because many non-radiative recombination centers exist. Namely, it was confirmed that the ZnO film grown at 450° C. has a crystallinity inferior to that of the ZnO film grown at 700° C. This is coincident with the measurement results of the X-ray double rocking curves shown in FIG. 8.

As described with reference to FIGS. 7 to 9 above, the ZnO film grown at 700° C. under the O rich condition has a relatively good crystallinity, however, it has a low activation ratio. On the other hand, the ZnO film grown at 450° C. has a relatively high activation ratio, however, it's crystallinity is not as good as that of ZnO film grown at 700° C.

Figure 1B:
FIGS. 1B to 1D show RHEED images of ZnO films formed under the conditions plotted at 1B to 1D shown in FIG. 1A.
Figure 1C:
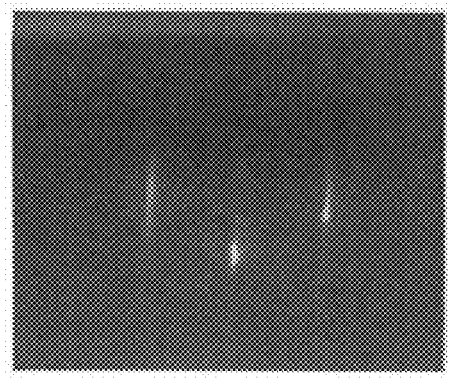
Figure 1D:

FIG. 1A is a graph showing the relation between a growth temperature Tg and a growth rate G of a ZnO film grown on a Zn polarity plane (+c plane) of a ZnO substrate and a ZnO film grown on an O polarity plane (−plane) of a ZnO substrate. FIGS. 1B to 1D show RHEED images of ZnO films formed under the conditions plotted at 1B to 1D shown in FIG. 1A, respectively.

Referring to FIG. 1A, the abscissa of the graph represents a growth temperature in the unit of "° C.", and the ordinate represents a growth rate in the unit of "nm/h". ZnO films were formed at an O flux intensity $J_O$ of $1.0 \times 10^{15}$ atoms/cm²·s and at a Zn flux intensity $J_{Zn}$ of $2.0 \times 10^{15}$ atoms/cm²·s.

The relation between the growth temperature Tg and growth rate G of ZnO films formed on the Zn polarity plane was plotted by white circles, and the relation of ZnO films formed on the O polarity plane was plotted by white squares.

ZnO films grow on the Zn polarity plane generally at a constant rate (about 560 nm/h) in the range shown in the graph (up to about 1000° C. of the growth 20 temperature Tg). On the other hand, ZnO films grow on the O polarity plane at a reduced growth rate as the growth temperature Tg increases. As we will see below, the ZnO re-evaporation rate $R_{ZnO}$ in the growth rate equation (1) is negligibly small on both planes in this temperature range. Therefore, this result indicates that the Zn sticking coefficient is generally constant on the Zn polarity plane, but the Zn sticking coefficient on the O polarity plane decreases as the growth temperature increases, in the range up to about 1000° C. of the growth temperature Tg. ($k_O$ is considered to be constant (=1) on both planes.)

FIG. 1B shows a RHEED image of a ZnO film grown under the condition plotted at 1B in FIG. 1A (at a growth temperature Tg of 800° C.). This RHEED image forms a spot pattern. It can be understood from this pattern that the ZnO film grows three-dimensionally.

FIG. 1C shows a RHEED image of a ZnO film grown under the condition plotted at 1C in FIG. 1A (at a growth temperature Tg of 850° C.). This RHEED image forms a streak pattern. It can be understood from this pattern that the ZnO film grows two-dimensionally. As compared to a ZnO film grown three-dimensionally, a ZnO film grown two-dimensionally has a better flatness.

FIG. 1D shows a RHEED image of a ZnO film grown under the condition plotted at 1D in FIG. 1A (at a growth temperature Tg of 1000° C.). Similar to the image shown in FIG. 1C, this RHEED image forms a streak pattern. It can be understood from this pattern that the ZnO film grows two-dimensionally even at the growth temperature Tg of 1000° C.

It can be confirmed from the RHEED images shown in FIGS. 1C and 1D that a ZnO film grows two-dimensionally at the growth temperature Tg of about 850° C. or higher.

A growth temperature is subjected to correction to a substantial growth temperature. As described above, the growth temperature Tg is a temperature set to a substrate heater. A substantial growth temperature (substrate surface temperature) Tgo is obtained from the growth temperature Tg.

Figure 2:
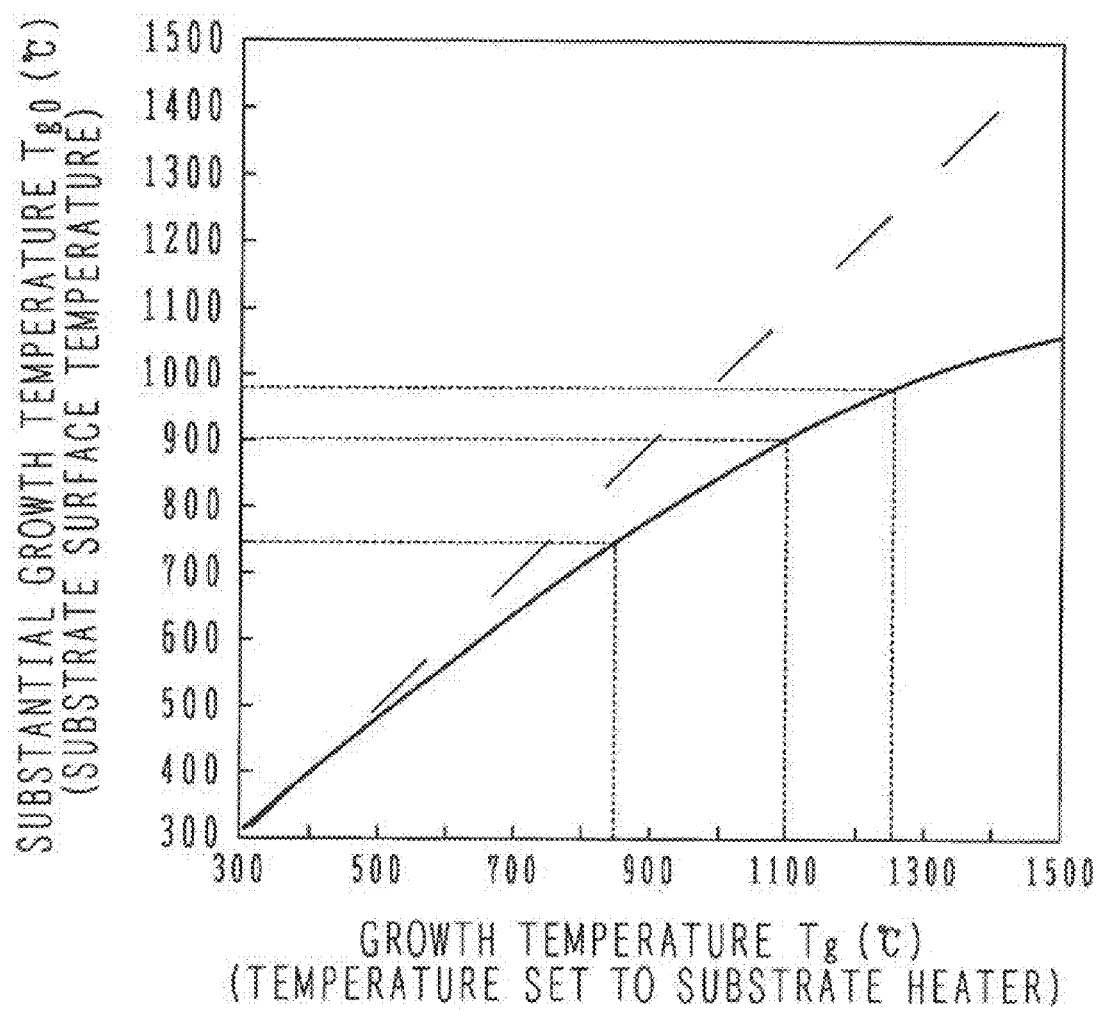
FIG. 2 is a graph showing the relation between a growth temperature Tg (the temperature set to a substrate heater) and a substantial growth temperature (substrate surface temperature) Tgo.

FIG. 2 is a graph showing the relation between a growth temperature (temperature set to a substrate heater) Tg and a substantial growth temperature (substrate surface temperature) Tgo.

The abscissa of the graph represents a growth temperature (temperature set to a substrate heater) Tg and the ordinate represents a substantial growth temperature (substrate surface temperature) Tgo, respectively in the unit of "° C.". The substantial growth temperature Tgo was measured with a pyrometer.

The growth temperature (temperature set to a substrate heater) Tg is not proportional to the substantial growth temperature (substrate surface temperature) Tgo, but as the growth temperature (temperature set to a substrate heater) Tg increases, the rate of the corresponding increase in the substantial growth temperature (substrate surface temperature) Tgo decreases. It can be seen from the graph that the substantial growth temperature (substrate surface temperature) Tgo is 740° C. at the growth temperature (temperature set to a substrate heater) Tg of 850° C. Thus, it can be understood that a ZnO film is grown two-dimensionally at the substantial growth temperature (substrate surface temperature) Tgo of about 740° C. or higher.

Figure 3:
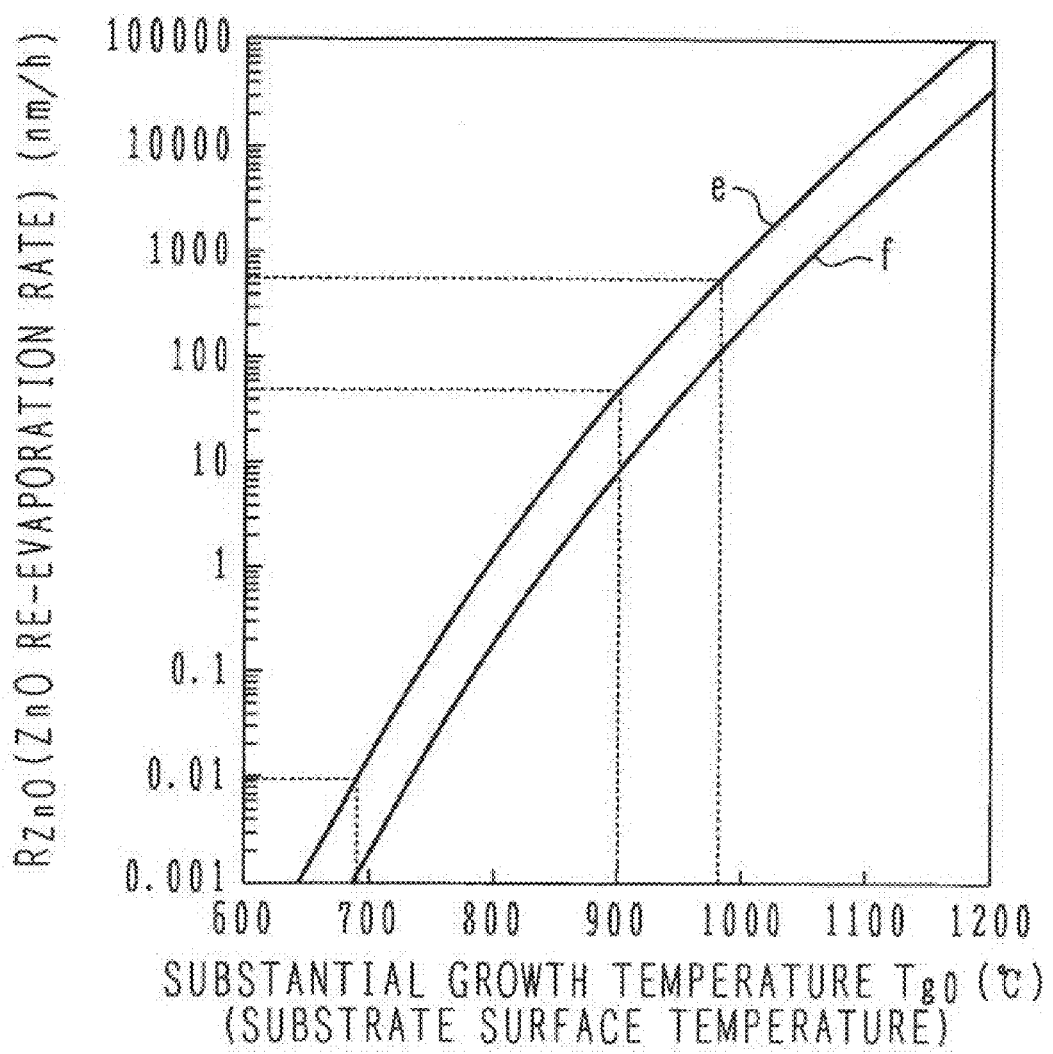
FIG. 3 is a graph showing the relation between a substantial growth temperature (substrate surface temperature) Tgo and a ZnO re-evaporation rate $R_{ZnO}$.

FIG. 3 is a graph showing the relation between a substantial growth temperature (substrate surface temperature) Tgo and a ZnO re-evaporation rate $R_{ZnO}$.

The curve "e" indicates the relation between a substantial growth temperature (substrate surface temperature) Tgo and a ZnO re-evaporation rate $R_{ZnO}$ when a ZnO film is grown on the Zn polarity plane of a ZnO substrate, and the curve "f" indicates the same relation when a ZnO film is grown on the O polarity plane of a ZnO substrate.

The abscissa of the graph represents the substantial growth temperature (substrate surface temperature) Tgo in the unit of "° C.", and the ordinate represents the ZnO re-evaporation rate $R_{ZnO}$ in the unit of "nm/h". The abscissa is in the linear scale and the ordinate is in the logarithmic scale.

The equation (1) for the growth rate of a ZnO film, which is presented in the preceding section, is reproduced below.

$$G = [(k_{Zn} \cdot J_{Zn})^{-1} + (k_O \cdot J_O)^{-1}]^{-1} - R_{ZnO} \quad (1)$$

In the equation (1), if the re-evaporation rate of ZnO is larger than the growth rate of ZnO, a ZnO film is not formed.

As described with reference to FIG. 1A, a ZnO film grows on the Zn polarity plane generally at a constant growth rate (about 560 nm/h) at least up to about 1000° C. of the growth temperature Tg, irrespective of the growth temperature Tg.

As discussed above, $R_{ZnO}$ is negligibly small in this temperature range. As shown in FIG. 3, beyond this temperature range, $R_{ZnO}$ increasingly becomes large. In order to allow a ZnO film to be grown at a higher temperature, the ZnO re-evaporation rate $R_{ZnO}$ must be equal to the ZnO growth rate (560 nm/h) or smaller.

Referring to FIG. 3, $R_{ZnO} \leq 560$ nm/h corresponds to the substantial growth temperature (substrate surface temperature) about 980° C. Referring to FIG. 2, the substantial growth temperature (substrate surface temperature) $\leq 980°$ C. corresponds to the growth temperature (temperature set to a substrate heater) $Tg \leq 1250°$ C.

The temperature range in which a ZnO film can be grown two-dimensionally can therefore be determined by the following formula (2) or (3):

$$\text{about } 850° C. \leq Tg \leq \text{about } 1250° C. \quad (2)$$

$$\text{about } 740° C. \leq Tgo \leq \text{about } 980° C. \quad (3)$$

In order to grow a ZnO film at a sufficiently high rate, the condition of $R_{ZnO} \leq 50$ nm/h is preferably introduced. As seen from FIG. 3, the condition of $R_{ZnO} \leq 50$ nm/h corresponds to the substantial growth temperature (substrate surface temperature) $Tg \leq$ about 900° C. According to FIG. 2, the substantial growth temperature (substrate surface temperature) $Tg \leq 900°$ C. corresponds to the growth temperature (temperature set to a substrate heater) $Tg \leq 1100°$ C.

Therefore, a more preferable temperature range in which a ZnO film can be grown two-dimensionally is given by the following formula (4) or (5), by taking a growth rate into consideration:

$$\text{about } 850° C. \leq Tg \leq \text{about } 1100° C. \quad (4)$$

$$\text{about } 740° C. \leq Tgo \leq \text{about } 900° C. \quad (5)$$

In the temperature range of the formula (4) or (5), a ZnO film can be grown two-dimensionally without lowering the growth rate.

The present inventors have found that the activation ratio can be improved by growing an epitaxial film of ZnO having n-type characteristics in the temperature range of the formula (4) or (5) and under the Zn rich condition.

Figure 4:
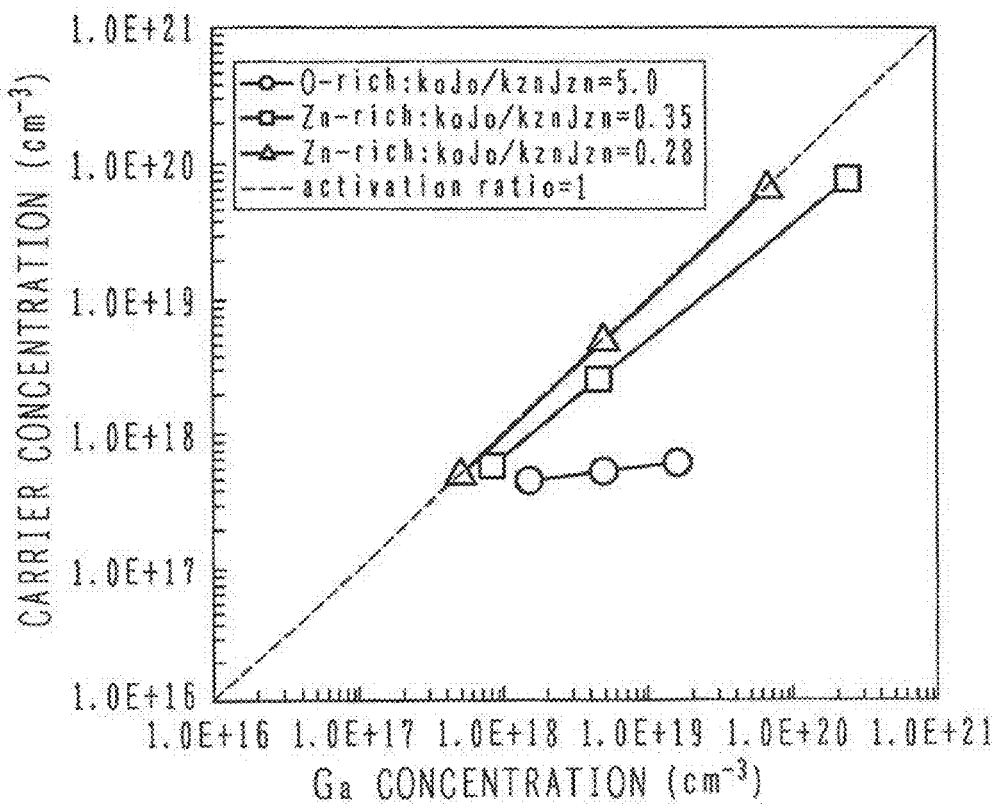
FIG. 4 is a graph showing the relation between a Ga concentration and a carrier (n) concentration in a ZnO film (doped with Ga impurities) epitaxially grown on a Zn polarity plane of a ZnO substrate.

FIG. 4 is a graph showing the relation between a Ga concentration and a carrier (n) concentration in a ZnO film (doped with Ga impurities) epitaxially grown on a Zn polarity plane of a ZnO substrate.

The abscissa of the graph represents a Ga concentration in ZnO films in the unit of "$cm^{-3}$", and the ordinate represents a carrier concentration in the unit of "$cm^{-3}$". Both axes are in the logarithmic scale. The Ga concentration and carrier concentration were measured by SIMS and Hall effects, respectively.

ZnO films were grown at a substantial growth temperature (substrate surface temperature) Tgo of 785° C. which corresponds to a growth temperature (temperature set to a substrate heater) Tg of 900° C. ZnO films were grown under various Zn rich and O rich conditions, and the relation between the Ga concentration and the carrier concentration of each ZnO film was analyzed.

In this graph, a straight line interconnecting white triangles indicates the relation between the Ga concentration and carrier concentration in ZnO films grown at a flux ratio of 0.28, which is a Zn rich condition. A straight line interconnecting white squares indicates the relation between these two quantities in ZnO films grown at a flux ratio of 0.35, which is a Zn rich condition. A straight line interconnecting white circles indicates the relation between these two quantities in ZnO films grown at a flux ratio of 5.0, which is an O rich condition.

The Zn rich condition at the flux ratio of 0.28 was realized at an O flux intensity $J_O$ of $5.5 \times 10^{14}$ atoms/cm$^2 \cdot$s and a Zn flux intensity $J_{Zn}$ of $2.0 \times 10^{15}$ atoms/cm$^2 \cdot$s (3.64 times the Zn rich condition). The Zn rich condition at the flux ratio of 0.35 was realized at an O flux intensity $J_O$ of $7.0 \times 10^{14}$ atoms/cm$^2 \cdot$s and a Zn flux intensity $J_{Zn}$ of $2.0 \times 10^{15}$ atoms/cm$^2 \cdot$s (2.86 times the Zn rich condition). The O rich condition at the flux ratio of 5.0 was realized at an O flux intensity $J_O$ of $1.0 \times 10^{15}$ atoms/cm$^2 \cdot$s and a Zn flux intensity $J_{Zn}$ of $2.0 \times 10^{14}$ atoms/cm$^2 \cdot$s. Note that at Tgo=785° C., the condition $k_O = k_{Zn} = 1$ is satisfied for epitaxial growth on the Zn polarity plane.

A broken line shown in FIG. 4 indicates an activation ratio of "1". The activation ratio is defined by (the carrier concentration)/(the Ga concentration) and is an index representing how much of doped Ga actually contributes to generation of carriers.

Referring to FIG. 4, the activation ratio of ZnO films formed under the O rich condition is low. The carrier concentration does not increase as fast as the Ga concentration as the Ga concentration increases. Therefore, as the Ga concentration increases, the activation ratio decreases. The activation ratio in the range shown in FIG. 4 is 0.04 to 0.29.

This result can be explained as follows. Ga doped in the ZnO film is oxidized and does not function as the carrier supplier at a high substantial growth temperature (substrate surface temperature) Tgo of 785° C. (corresponding to a high growth temperature (temperature set to a substrate heater) Tg of 900° C.).

In contrast, the activation ratios of ZnO films formed under the Zn rich condition are higher. For example, the ZnO film formed under the Zn rich at the flux ratio of 0.28 has an activation ratio of nearly "1" at the Ga concentration of about $5.0 \times 10^{17}$ cm$^{-3}$ or higher and about $7.0 \times 10^{19}$ cm$^{-3}$ or lower.

The present inventors also have discovered that at least when the Ga concentration is within a range from about $5.0 \times 10^{17}$ cm$^{-3}$ to about $7.0 \times 10^{19}$ cm$^{-3}$, a ZnO film having an activation ratio of 0.5 or higher can be formed by growing the ZnO film in the temperature range of the formula (4) or (5) under a Zn rich condition (which includes, but not limited to 2.86 times or 3.64 times the Zn rich condition). It has also been found that the ZnO films grown in the above-described Ga concentration range have a good crystallinity and a good $D^0X$ optical emission intensity.

In order to grow a ZnO film of good quality, it is preferable to grow the ZnO film under an Zn rich condition (i.e., the flux ratio of 1 or smaller), and more preferably, under an Zn rich condition of the flux ratio being about 0.35 or smaller. This more preferable range of the flux ratio is derived by the following observation. As shown in FIG. 4, at a Ga concentration of about $5.0 \times 10^{18}$ cm$^{-3}$, the activation ratio is 0.28 for the O rich condition of the flux ratio being 5.0, the activation ratio is 0.50 for the Zn rich condition of the flux ratio being 0.35, and the activation ratio is 0.94 for the Zn rich condition of the flux ratio being 0.28. Therefore, based on these examples, if we set a desired activation ratio to 0.5 or larger, then, the flux ratio should be about 0.35 or smaller.

The reason why the activation ratio is low under the O rich condition may be due to the phenomenon that $Ga_2O_3$ or $ZnGa_2O_4$ is formed by oxidation of Ga and replacement to Zn sites of ZnO with Ga is not effected. It is considered that the Zn rich condition reduces generation of $Ga_2O_3$ or $ZnGa_2O_4$ and realizes a high activation ratio.

An epitaxial film having a good flatness can be formed by forming a ZnO film in the temperature range of the formula (4) or (5). Since the ZnO film can be grown at a fast growth rate by adopting the Zn rich condition, the ZnO film can be formed in a short time and at a low cost.

The present inventors contemplates that similar results are obtained if Al or In is used in place of Ga as n-type impurities for ZnO crystal.

Instead of ZnO crystal, n-type ZnO based compound semiconductor crystal may be grown, such as ZnMgO, ZnCdO and ZnSeO. ZnO based compound semiconductor crystal is represented by $Zn_{1-(x+y+z)}Mg_xBe_yCd_zO_{1-(\alpha+\beta+\gamma)}S_\alpha Se_\beta Te_\gamma$ ($x+y+z \leq 0.5$, $\alpha+\beta+\gamma \leq 0.5$) (mixed crystal containing ZnO as a base, Mg, Be and Cd are located at Zn sites and S, Se and Te are located at O sites). In this applications, the term "ZnO based semiconductor" and "ZnO based semiconductor crystal" is broadly construed to include ZnO semiconductor and ZnO semiconductor crystal, respectively, as well as ZnO based compound semiconductor and ZnO based compound semiconductor crystal, respectively.

ZnO crystal and ZnO based compound semiconductor crystal may be grown not only on a ZnO substrate, but also on a single crystal substrate (sapphire substrate, GaN template, SiC substrate or the like) capable of growing ZnO based compound semiconductor crystal having the Zn polarity plane.

The present invention can be applied not only to an n-type ZnO film, but also to a p-type ZnO film.

Next, description will be made on a manufacture method for a ZnO based light emitting device having a ZnO film doped with Ga and formed on the Zn polarity plane.

Figure 5:
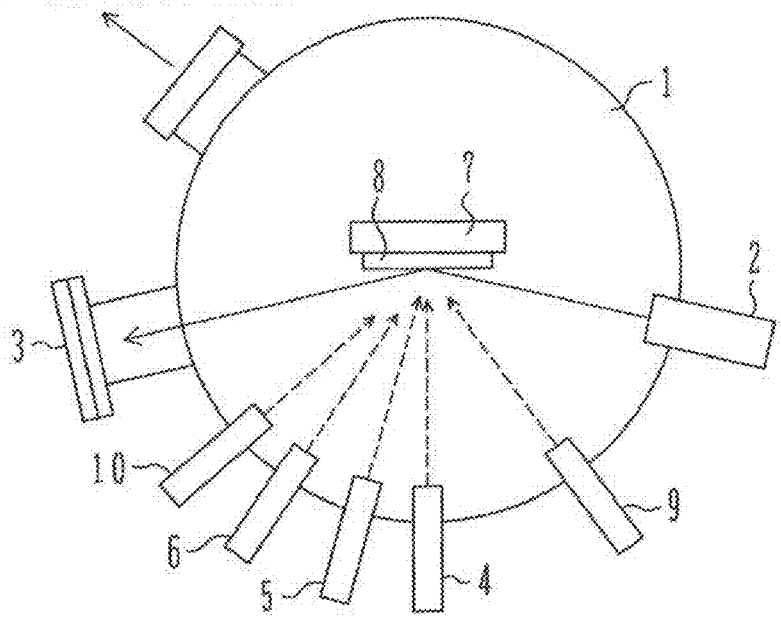
FIG. 5 is a schematic diagram of a manufacture system for manufacturing ZnO based compound semiconductor crystal using MBE, the manufacture system being used with a manufacture method for ZnO based compound semiconductor crystal according to an embodiment.

FIG. 5 is a schematic diagram showing a manufacture system for manufacturing ZnO based compound semiconductor crystal using MBE according to an embodiment. The ZnO based compound semiconductor crystal is used for the manufacture of a ZnO based light emitting device. By using the ZnO based compound semiconductor crystal manufacture system, n-type ZnO based compound semiconductor crystal can be grown two-dimensionally without lowering the growth rate, which crystal has an activation ratio of 0.5 or higher and has a Ga concentration ranging from $5.0 \times 10^{17}$ cm$^{-3}$ or higher to $7.0-10^{19}$ cm$^{-3}$ or lower.

Referring to FIG. 5, in this example, a stage 7 is mounted in an ultra high vacuum chamber 1, and a single crystal substrate 8 is placed on the stage 7. The ultra high vacuum chamber 1 is equipped with a zinc source gun 4 for radiating a zinc beam from a K cell; an oxygen source gun 5 for radiating an oxygen radical beam formed by making radical of an oxygen gas; a gallium source gun 6 for irradiating a gallium beam from a K cell; a nitrogen source gun 9 for radiating a nitrogen radical beam formed by making radical of a nitrogen gas; and a magnesium source gun 10 for radiating a magnesium beam from a K cell. The beams from these source guns can be radiated at the same time to the single crystal substrate 8 to form ZnO crystal or ZnO based compound crystal on the single crystal substrate 8.

The ultra high vacuum chamber 1 is also equipped with a RHEED gun 2 and a RHEED screen 3. Electrons radiated from the RHEED gun 2 are diffracted by ZnO crystal formed on the single crystal substrate 8 and enter the RHEED screen 7. ZnO crystal formed on the single crystal substrate 8 can be observed on the RHEED screen.

The source gas for the nitrogen radical beam to be radiated from the nitrogen source gun 9 may be, for example, nitrogen dioxide ($NO_2$), nitrous oxygen ($N_2O$) or the like. Alternatively, ammonium ($NH_3$) may be subject to cracking to generate the nitrogen radical beam from the nitrogen source gun 9.

FIGS. 6A to 6D are schematic cross sectional views illustrating a manufacture method for ZnO based light emitting device according to an embodiment of the present invention.

Figure 6A:
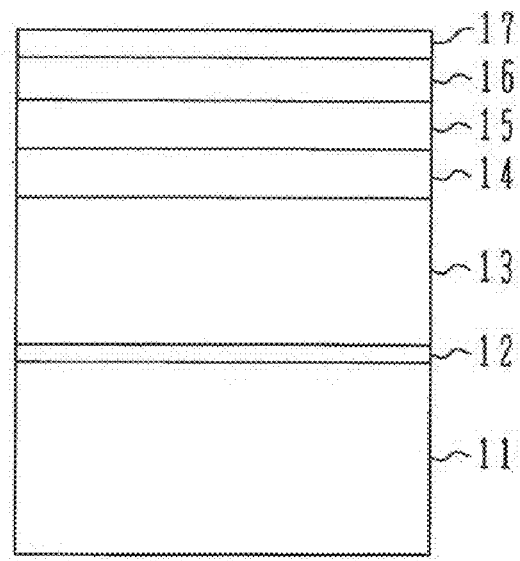
FIGS. 6A to 6D are schematic cross sectional views illustrating a manufacture method for ZnO based compound semiconductor crystal.

Referring to FIG. 6A, a ZnO substrate 11 is first prepared. The prepared ZnO substrate 11 is subject to wet etching for cleaning before being loaded to the ZnO based compound semiconductor crystal manufacture system of FIG. 5. Thereafter, the ZnO substrate 11 is placed on and held by the stage in the ZnO based compound semiconductor crystal manufacture system. The ZnO substrate 11 is then subject to thermal annealing at 800° C. to 900° C. to clean the substrate surface. Thereafter, by selectively radiating appropriate beams to the cleaned ZnO substrate 11, various films are formed by MBE in a vapor phase.

First, an n-type ZnO buffer layer 12 is formed on the Zn polarity plane of the cleaned ZnO substrate 11. A thickness of the buffer layer is, for example, 100 angstrom to 300 angstrom, and the buffer layer is grown at a growth temperature of 300° C. to 500° C.

Next, an n-type ZnO layer 13 doped with Ga is formed on the surface of the n-type ZnO buffer layer 12 by MBE under a Zn rich condition of the flux ratio of 0.35 or smaller, for example. A Ga concentration is set between about $5.0 \times 10^{17}$ cm$^{-3}$ and about $7.0 \times 10^{19}$ cm$^{-3}$, for example. The n-type ZnO layer is grown to a thickness of 1 to 2 μm, at a growth temperature (temperature set to a substrate heater) of 850° C. to 1100° C., which corresponds to a substantial growth temperature (substrate surface temperature) of 740° C. to 900° C. The n-type ZnO layer 13 has an activation ratio of about 0.5 or higher.

Next, an n-type ZnMgO layer 14 is grown on the surface of the n-type ZnO layer 13 to a thickness of 1000 angstrom to 6000 angstrom at a growth temperature lower than that for the n-type ZnO layer 13.

A ZnO/ZnMgO quantum well layer 15 is formed on the surface of the n-type ZnMgO layer 14 at a growth temperature of 500° C. to 900° C. Impurities are not doped. The ZnO/ZnMgO quantum well layer 15 will be later described in detail.

A p-type ZnMgO layer 16 doped with nitrogen is formed on the surface of the ZnO/ZnMgO quantum well layer 15 to a thickness of 1000 angstrom to 3000 angstrom at a growth temperature of 500° C. to 1000° C. A nitrogen concentration is set to $1 \times 10^{18}$ cm$^{-3}$ or higher.

Lastly, a p-type ZnO layer 17 doped with nitrogen at a concentration of $1 \times 10^{19}$ cm$^{-3}$ or higher is grown on the surface of the p-type ZnMgO layer 16 to a thickness of 1000 angstrom to 2000 angstrom at a growth temperature of 500° C. to 1000° C.

Figure 6B:

Referring to FIG. 6B, the ZnO/ZnMgO quantum well layer 15 has a lamination structure of a barrier layer 15b of ZnMgO stacked on a well layer 15w of ZnO.

Figure 6C:
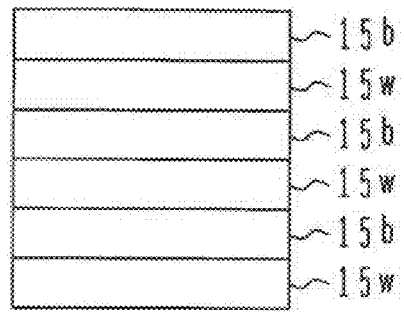

Referring to FIG. 6C, the ZnO/ZnMgO quantum well layer 15 may be a multiple quantum well layer having a plurality of the lamination structures of the well layer 15w and barrier layer 15b.

Figure 6D:
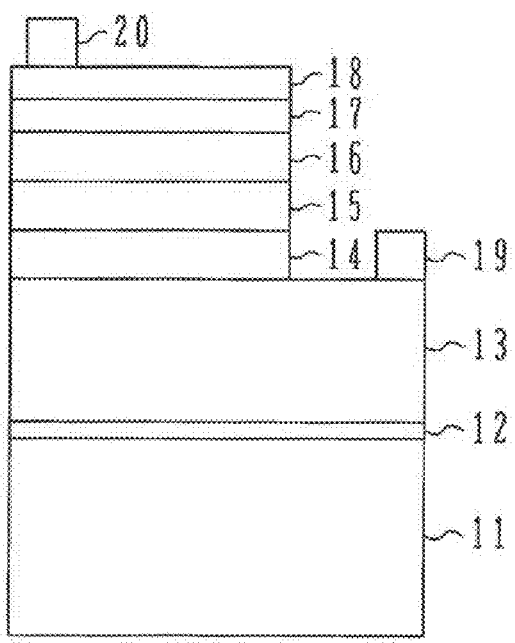

Referring to FIG. 6D, after the layer (film) forming processes described above, electrodes are formed. The ZnO substrate 11 having a lamination of layers from the n-type ZnO buffer layer 12 to p-type ZnO layer 17 is unloaded from the ZnO based compound semiconductor crystal manufacture system, and a resist film, a protective film or the like is formed to form an etching mask having a recess window (n-type electrode forming portion) of a predetermined pattern. Thereafter, the layers above the ZnO substrate is etched through the recess window by wet etching or reactive ion etching until the surface of the n-type ZnO layer 13 is exposed. An n-type electrode 19 is formed on the surface of the n-type ZnO layer 13. The n-type electrode may have a lamination structure of an aluminum layer of 3000 angstrom to 5000 angstrom in thickness formed on a titanium layer of 20 angstrom to 100 angstrom in thickness.

Next, the etching mask used for forming the n-type electrode 19 is removed. A p-type transparent electrode 18 is formed on the surface of the p-type ZnO layer 17. The p-type transparent electrode may have a laminated structure of a nickel layer of 5 angstrom to 10 angstrom in thickness and a gold layer of 100 angstrom in thickness stacked on the nickel layer.

A bonding electrode 20 made of gold having a thickness of, e.g., 5000 angstrom, is formed on the p-type transparent electrode 18. Thereafter, an electrode alloying process is executed in an oxygen atmosphere at a temperature of, e.g., 700° C. to 800° C. The alloying process time is 3 minutes to 10 minutes, for example. A ZnO based light emitting device is therefore manufactured in the manner described above.

The light emitting device may be used as a short wavelength (wavelength of ultraviolet to blue) light emitting diode (LED), a short wavelength laser diode (LD), application products of these diodes (e.g., indicators, LED displays and the like), a white color LED and its application products (e.g., illumination instruments, indicators, displays, back light illumination for display apparatus and the like).

The present invention has been described in connection with the preferred embodiments. The invention is not limited only to the above embodiments. For example, in the embodiment although the light emitting device is manufactured by growing ZnO crystal, the light emitting device may be manufactured by growing ZnO based compound semiconductor crystal. It will be apparent to those skilled in the art that other various modifications, improvements, combinations, and the like can be made.

What we claim are:

1. A manufacture method for a ZnO based light emitting device, comprising:
   (a) forming an n-type ZnO buffer layer on a Zn polarity plane of a substrate;
   (b) forming an n-type ZnO layer over said n-type ZnO buffer layer;
   (c) forming an n-type ZnMgO layer over said n-type ZnO layer;
   (d) forming a ZnO/ZnMgO quantum well layer over said n-type ZnMgO layer, said ZnO/ZnMgO quantum well layer being formed by alternately laminating a ZnO layer and a ZnMgO layer;
   (e) forming a p-type ZnMgO layer over said ZnO/ZnMgO quantum well layer; and
   (f) forming a p-type ZnO layer over said p-type ZnMgO layer, wherein said n-type ZnO layer is formed in a Zn rich condition in said step (b),
   wherein said Zn rich condition corresponds to a flux ratio of about 0.35 or smaller, the flux ratio being defined as $k_O \cdot J_O / k_{Zn} \cdot J_{Zn}$, where $J_{Zn}$ is a flux intensity of Zn, $J_O$ is a flux intensity of O radical, $k_{Zn}$ is a Zn sticking coefficient indicating a bonding feasibility of Zn to an O terminated plane of ZnO crystal, and $k_O$ is an O sticking coefficient indicating a bonding feasibility of O to a Zn terminated plane of ZnO crystal.

2. The manufacture method according to claim 1, wherein in said step (b), said n-type ZnO layer is formed while a temperature of said substrate is set between about 740° C. and about 900° C.

3. The manufacture method according to claim 1, wherein step (b) includes doping impurities of at least one of gallium (Ga), aluminum (Al) and indium (In) to said n-type ZnO layer at a concentration between about $5.0 \times 10^{17}$ cm$^{-3}$ and about $7.0 \times 10^{19}$ cm$^{-3}$.

4. The manufacture method according to claim 1, wherein in said step (b), said n-type ZnO layer is formed by MBE.

5. The manufacture method according to claim 1, further comprising:
   (g) forming an electrode connected to said n-type ZnO layer; and
   (h) forming an electrode connected to said p-type ZnO layer.

* * * * *